(12) United States Patent
Tsuda

(10) Patent No.: US 6,748,749 B2
(45) Date of Patent: Jun. 15, 2004

(54) OPEN TYPE MAGNETIC RESONANCE IMAGING APPARATUS

(75) Inventor: Munetaka Tsuda, Mito (JP)

(73) Assignee: Hitachi Medical Corporation, Tokyo (JP)

( * ) Notice: Subject to any disclaimer, the term of this patent is extended or adjusted under 35 U.S.C. 154(b) by 191 days.

(21) Appl. No.: 10/096,453

(22) Filed: Mar. 13, 2002

(65) Prior Publication Data

US 2002/0130662 A1 Sep. 19, 2002

(30) Foreign Application Priority Data

Mar. 16, 2001 (JP) ........................ 2001-075814

(51) Int. Cl.$^7$ ............................ F17G 13/02; F25B 19/00
(52) U.S. Cl. ............................ 62/49.2; 62/51.1
(58) Field of Search ................... 62/49.2, 51.1

(56) References Cited

U.S. PATENT DOCUMENTS

| | | | | |
|---|---|---|---|---|
| 4,198,828 A | * | 4/1980 | Mercier et al. | 62/50.1 |
| 4,655,079 A | * | 4/1987 | Masumoto et al. | 73/295 |
| 5,018,387 A | * | 5/1991 | Myneni | 73/295 |
| 5,593,949 A | * | 1/1997 | Leung et al. | 505/160 |
| 5,671,603 A | * | 9/1997 | McCorkle et al. | 62/49.2 |
| 6,011,456 A | * | 1/2000 | Eckels et al. | 335/300 |
| 6,023,633 A | * | 2/2000 | Kado | 600/409 |
| 6,275,719 B1 | * | 8/2001 | Kandori et al. | 600/409 |

FOREIGN PATENT DOCUMENTS

JP    60213070 A    * 10/1985

* cited by examiner

Primary Examiner—William C. Doerrler
(74) Attorney, Agent, or Firm—Antonelli, Terry, Stout & Kraus, LLP

(57) ABSTRACT

Within upper and lower cryostats for a super conducting magnet level sensors which measure respective amounts of liquid helium therein are assembled and are connected to a measuring circuit. When a control signal of a computer is provided to the measurement circuit via a sequencer, the measurement circuit performs automatic measurement of a remaining amount of liquid helium and the measured data is transferred to the computer. The computer records the measured data as well as performs computation processing thereof and causes a display unit to display the processing result as an effective management parameter of the liquid helium. Thereby, an open type MRI apparatus using a super conducting magnet with liquid helium monitoring system which is suitable for maintenance and management of liquid helium for the super conducting magnet can be provided.

13 Claims, 8 Drawing Sheets

OPEN TYPE MAGNETIC RESONANCE IMAGING APPARATUS

BACKGROUND OF THE INVENTION

1. Field of the Invention

The present invention relates an open type magnetic resonance imaging (hereinafter will be referred to as MRI) apparatus using a super conducting magnet which does not give a pressing feeling to a person to be inspected and, more specifically, relates to such MRI apparatus in which maintenance and management of cooling medium for the super conducting magnet is accurate and easy.

2. Conventional Art

An MRI apparatus which produces a tomographic picture image of a human body by making use of Nuclear Magnetic Resonance (NMR) phenomenon is broadly used in medical facilities. In such MRI apparatus a magnet for generating a uniform static magnetic field in a space where a person to be inspected is laid is provided. As such static magnetic field generation magnet, a permanent magnet, a normal conducting magnet and a super conducting magnet are conventionally used. Among these, application of the super conducting magnet to the MRI apparatus is widespreading because with the super conducting magnet a strong static magnetic field can be generated, thereby, a high speed image taking and a high quality picture image can be realized.

As conventional coils for static magnetic field generation long and narrow cylindrical solenoid coils were generally used, however, an MRI apparatus having such a magnet structure which requires a person to be inspected to be laid in a long and narrow space gives the person to be inspected a pressing feeling and is not appropriate for inspecting such as a claustrophobia and a child. In contrast thereto, an open type MRI apparatus is in these days becoming popular in which a pair of magnets generating comparatively low magnetic field are disposed so as to locate the image taking space therebetween and the image taking space is opened in which the person to be inspected is laid. Further, for the magnet in such open type MRI apparatus, in place of the conventional permanent magnet and normal conducting magnet coils, a development of a magnet in which super conducting coils are assembled is now advancing.

However, in such open type MRI apparatus, since a cryostat which accommodates the super conducting coils is disposed after being divided into a plurality of units, a different maintenance and management from one for the conventional super conducting magnet is required.

Namely, almost all of the conventional super conductive magnets were constituted by winding wire around a cylindrical bobbin in a solenoid shape and were disposed in a single liquid helium vessel. Since direction of the generated magnetic field is in horizontal direction, the axis of the solenoid coils is also disposed in horizontal direction. For this reason, even if an amount of liquid helium in the vessel decreases by about 20% each part of respective turns of the super conducting coil is still immersed in the liquid helium in the vessel, thereby, the super conducting coil can be kept stably at temperature of 4.2° K. Further, when managing the amount of liquid helium, it was sufficient if the single liquid level is measured.

Contrary thereto, in an open type MRI apparatus in which a pair of solenoid coils are disposed above and below the image taking space where the person to be inspected is laid so that the axis of the pair of solenoid coils directs in vertical direction, when the liquid helium in the vessel decreases a part of turns of the super conducting coil completely emerges from the liquid helium surface, thereby, the super conducting condition of the coil is suddenly broken which possibly prevents measurement of MRI.

Further, since the decreasing speeds of liquid helium in the upper and lower cryostats are not necessarily the same, the lower limit values of the liquid helium amount in the upper and lower cryostats which can keep super conductivity of the coils are different, it is necessary to manage the liquid helium amount for every upper and lower cryostats.

Namely, in the open structured super conducting magnet, in order to enhance magnetic field generation efficiency it is preferable to dispose respective super conducting coils near to the picture taking space as much as possible, therefore, the super conducting coil in the upper cryostat is disposed at the bottom portion thereof and the super conducting coil in the lower cryostat is disposed at the top portion thereof. As a result, even if the liquid helium in the upper and lower cryostats is evaporated likely, the coil in the lower cryostat emerges early from the liquid helium surface. For this reason, the management of liquid helium amount in the upper and lower cryostats is to be performed independently and separately which makes the management difficult of the open type super conducting magnet.

The above problem becomes further important for an open type super conducting magnet in which a plurality of coils of different configurations are disposed in each cryostat in order to improve magnetic field uniformity and to limit leakage magnetic field distribution space.

JP-A-11-16718 (1999) discloses a provision of individual level sensors for upper and lower cryostats for a super conducting magnet, however, nowhere discloses any specific separate liquid helium monitoring system using the individual level sensors.

SUMMARY OF THE INVENTION

The present invention has been achieved in view of the above problems and an object of the present invention is to provide an open type MRI apparatus using a super conducting magnet in which maintenance and management of cooling medium for the super conducting magnet can be performed accurately and easily, thereby, such as breaking of super conducting condition of the super conductive magnet can be surely prevented.

An MRI apparatus of the present invention which achieves the above object comprises: a static magnetic generating device including a pair of upper and lower static magnetic field generating sources which are disposed so as to locate a space for laying a person to be inspected therebetween and respective containers each accommodating one of the pair of upper and lower magnetic field generating sources, each of the magnetic field generation sources is constituted by not less than one super conducting coil, each of the containers contains cooling medium which keeps the super conducting coil at a predetermined temperature, and further comprises measurement means each of which is disposed in every containers and sends out an electrical signal representing an amount of cooling medium therein and computing means which receives the electrical signals from the respective measuring means and computes amount of cooling medium and/or variation in amount of cooling medium in the respective containers.

In the present invention, since the amount of cooling medium in every respective containers is measured, management of the amount of cooling medium becomes accurate and easy.

In the MRI apparatus according to the present invention further comprises a display unit which displays an amount of cooling medium and/or a variation in amount of cooling medium in respective containers together with allowable lower limit values for the amount of cooling medium in every respective containers. Through confirming the amount of cooling medium and/or variation in the amount of cooling medium in every respective containers which are displayed together with the allowable lower limit value therefor via the display unit, a decrease of cooling medium in the respective containers can be visually grasped, thus, even when the lower limit values of the cooling medium for the respective containers are different, the management thereof is facilitated. The amount of cooling medium and/or variation in the amount of the cooling medium can be displayed either by numeral values in digital or by graphs formed by plotting the amounts with respect to time.

Further, the MRI apparatus of the present invention, preferably, comprises means which generates an alarm either when an amount of cooling medium reaches the predetermined lower limit value or when a variation in the amount of cooling medium exceeds the predetermined value.

For the alarming conventional measures such as alarming lamp and alarm by sound such as beep sound can be used. Through such alarming even when cooling medium suddenly decreases by any causes, an immediate action therefor can be taken, and an accident of the cryostats due to man-made mistakes can be prevented.

Further, the MRI apparatus of the present invention comprises a control means which controls the measurement means and the computing means so that the measurement by the measurement means and computation by the computing means are performed with a desired time interval.

Through performing the measurement with a predetermined time interval set by the control means, an amount of cooling medium in the upper and lower containers can be monitored automatically and periodically.

DETAILED DESCRIPTION OF THE PREFERRED EMBODIMENTS

Hereinbelow, preferred embodiments of the present invention will be explaining with reference to the drawings.

Figure 1:
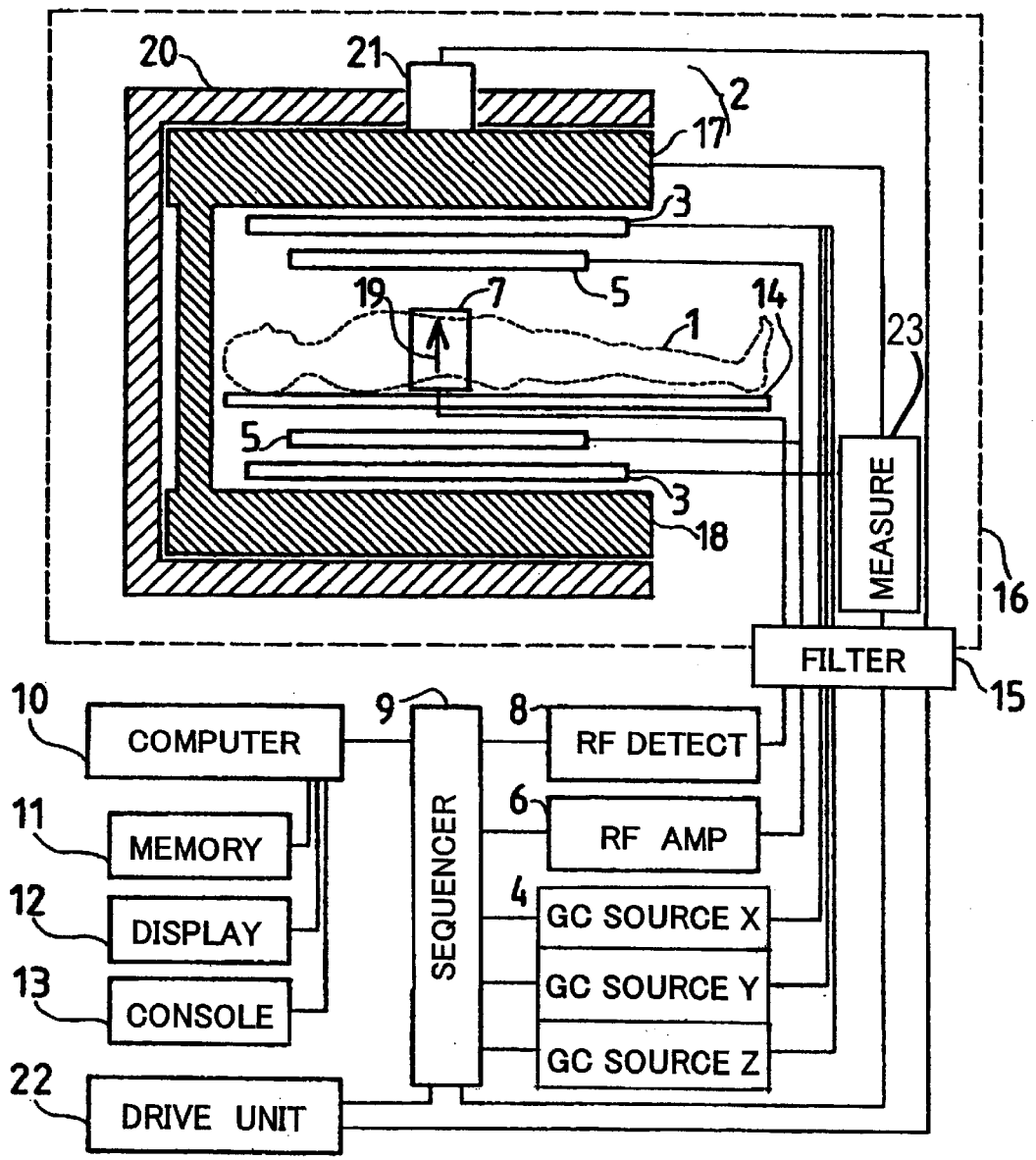
FIG. 1 is a schematic diagram showing an entire structure of an MRI apparatus to which the present invention is applied.

FIG. 1 is a schematic diagram of an entire structure of an MRI apparatus to which the present invention is applied. The MRI apparatus is provided with a super conducting magnet 2 including a pair of upper and lower super conducting coils which are disposed so as to locate a space for laying a person 1 to be inspected therebetween, gradient magnetic field coils 3 each being disposed inside the super conducting magnet 2, radio frequency coils 5, each being disposed further inside the respective gradient magnetic field coils 3, a detection coil 7 for detecting NMR signals being generated from the person 1 to be inspected and a table 14 which is designed to move the person 1 to be inspected into a center space of the super conducting magnet 2.

The gradient magnetic field coils 3 and the radio frequency coils 5 are respectively structured in a pair of upper and lower plate shapes so as not to disturb the configuration of the open type super conducting magnet 2. The super conducting magnet 2, the gradient coils 3, the radio frequency coils 5, the detection coil 7 and the table 14 are disposed within a magnetic wave shielding room 16 so that influences of external magnetic wave noises mixing into the MRI signals can be minimized.

The MRI apparatus is further provided with drive power sources 4, 6 and 8 which drive the above referred to respective coils, a sequencer 9 which controls the operation timing of these drive power sources and a computer 10 which controls the device itself as well as processes the NMR signals to construct picture images. The above referred to units are disposed outside the magnetic wave shielding room 16, and the drive power sources for the respective coils are connected to the respective corresponding coils in the magnetic field shielding room 16 via a filter circuit 15 so as to minimize the influence of magnetic wave noises.

The super conducting magnet 2 in the present embodiment as shown includes a pair of upper and lower cryostats, in that an upper cryostat 17 and a lower cryostat 18, and in each of the cryostats a super conducting coil is accommodated in such a manner that the axis of the super conducting coil directs in vertical direction. With the use of such arrangement structure, a uniform static magnetic field is generated which is directed to crossing direction (as shown by an arrow 19 in FIG. 1) with respective to the body axis of the person 1 to be inspected which is laid horizontally within a photographing space. Further, although not illustrated in the drawing, the super conducting magnet 2 is provided with a shimming means such as passive shimming and active shimming in order to achieve a predetermined magnetic field uniformity. In case of the passive shimming, a plurality of small pieces of magnetic body serving as the shimming means are bonded on the respective surfaces of the upper and lower cryostats 17 and 18. Through the use of these shimming means, a uniform static magnetic field is formed, for example, a spherical space having a diameter of 40 cm of which uniformity variation rate can be adjusted less than about 3 ppm is formed.

Further, an iron yoke 20 is provided so as to surround the respective upper and lower cryostats 17 and 18. Through formation of a closed magnetic circuit with the iron yoke 20 magnetic flux leaking outside the magnet can be reduced. Further, a cryo cooler 21 which keeps the cooling medium within the upper and lower cryostats 17 and 18 in a low temperature and reduces amount of evaporation of the liquid helium therein is attached to the upper cryostat 17. The cryo cooler 21 is connected to a drive unit 22 and the operating state of the drive unit 22 is inputted to the computer 10 via the sequencer 9.

Further, in each of the upper and lower cryostats 17 and 18 a level sensor is assembled which measures respective amount of liquid helium and to the respective sensors a measurement circuit 23 is connected. Signals from the measurement circuit 23 are inputted to the sequencer 9 and the computer 10 via the filter circuit 15.

Each of the gradient magnetic field coils 3 is constituted by three sets of coils which are respectively wound so as to vary magnetic flux density in three x, y and z axial directions perpendicularly crossing each other. The respective coils are connected to the corresponding gradient magnetic field power sources 4, and through driving the gradient magnetic field power sources 4 according to control signals from the sequencer 9 values of current flowing through the gradient magnetic field 3 are varied and gradient magnetic fields Gx, Gy and Gz constituted by three axial components are applied to the person 1 to be inspected. These gradient magnetic fields are used to discriminate spatial distribution of NMR signals obtained from an inspection portion of the person 1 to be inspected.

The radio frequency coils 5 are connected to a radio frequency power amplifier 6 which causes to flow a radio frequency current to the radio frequency coils 5 and to generate a high frequency magnetic field having a frequency which resonates and excites nuclei (usually hydrogen nuclei are used) at the inspection portion of the person 1 to be inspected. The radio frequency power amplifier 6 is also controlled by control signals from the sequencer 9.

The detection coil 7 is connected to a radio frequency amplifying and detecting circuit 8 and detects the NMR signals. The radio frequency amplifying and detecting circuit 8 amplifies and detects the NMR signals detected by the detection coil 7 as well as converts the same into digital signals which permit processing in the computer 10. The operation timing of the radio frequency amplifying and detecting circuit 8 is also controlled by the sequencer 9.

The computer 10 performs picture image reconstruction by making use of the NMR signals converted into digital amount and computings such as spectrum calculation as well as controls operation of the respective units in the MRI apparatus at a predetermined timing via the sequencer 9. Further, in the present embodiment, the computer 10 is inputted signals from the measurement circuit 23 which has measured with regard to the amount of liquid helium in the respective upper and lower cryostats 17 and 18, and computes the current amount of liquid helium and/or the variation in amount of liquid helium. In order to perform the above referred to processings and computation, the computer 10 is provided with a memory unit 11 which stores data, a display unit 12 which displays data after being processed and a console 13 through which the computer 10 is operated and through which such as a photographing condition and measurement condition of the amount of liquid helium are inputted.

Figure 2:
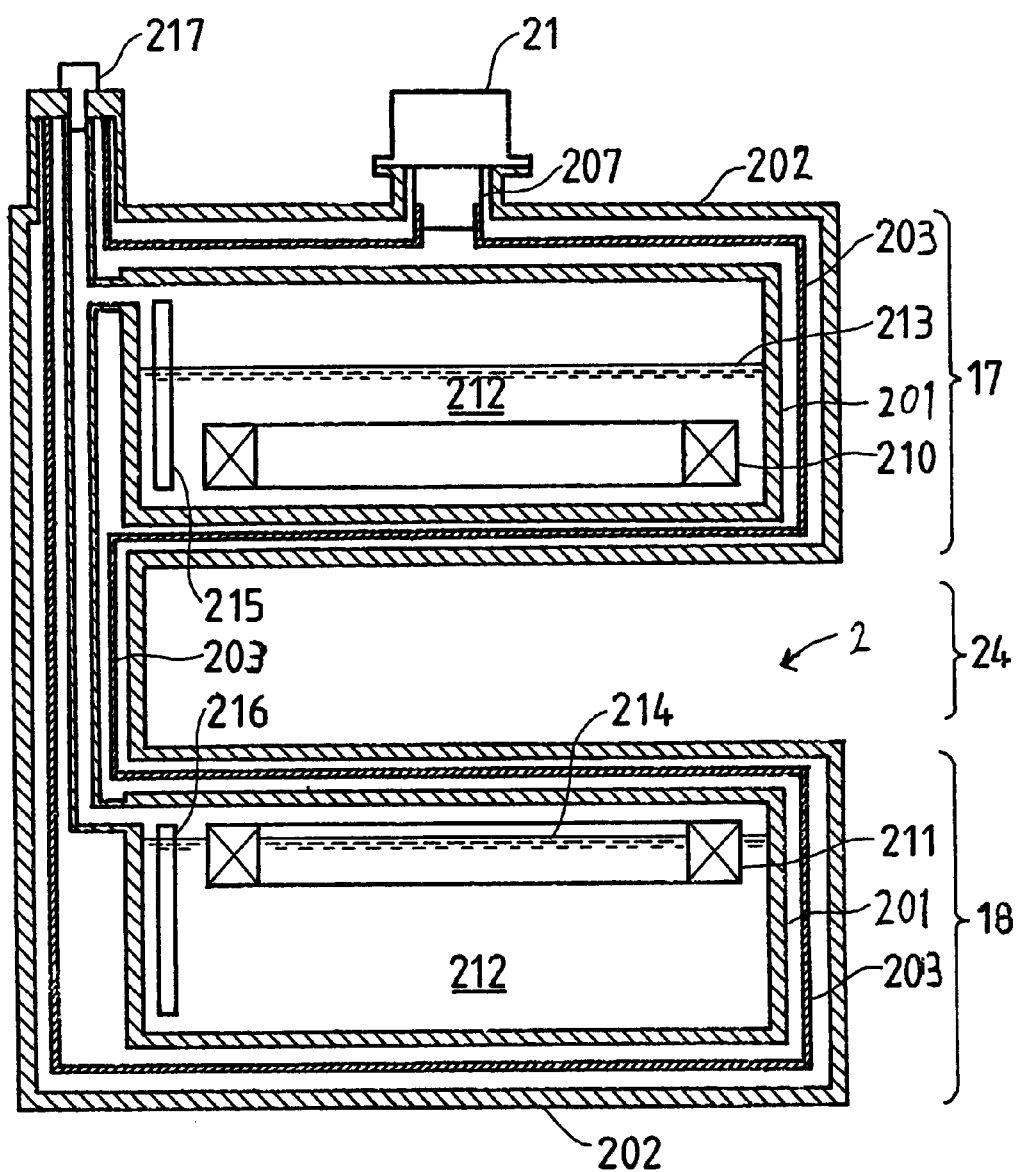
FIG. 2 is a cross sectional view showing an example of a super conducting magnet according to the present invention.

FIG. 2 is a diagram showing an internal structure of the upper and lower cryostats 17 and 18 in the super conducting magnet 2 as shown in FIG. 1. As shown in the drawing, each of the cryostats 17 and 18 is constituted by a helium vessel 201 in which liquid helium 212 is filled, a vacuum vessel 202 which thermally isolates the helium vessel 201 from outer atmospheric air and a heat shield 203 interposed between the helium vessel 201 and the vacuum vessel 202 and super conducting coils 210 and 211 are disposed in the respective helium vessels 201 so as to immersed the same under the liquid helium 212. Further, in the drawing only a pair of upper and lower super conducting coils 210 and 211 are illustrated, it is possible to assemble a plurality of pairs of super conducting coils in the respective helium vessels 201. Numeral 24 is a connecting portion between the upper and lower cryostats 17 and 18.

As illustrated in the drawing, in order to enhance magnetic field generation efficiency of the super conducting coils 210 and 211, with regard to the upper cryostat 17 the upper super conducting coil 210 is disposed at the bottom portion of the helium vessel 201, and with regard to the lower cryostat 18 the lower super conducting coil 211 is disposed at the top portion of the helium vessel 201, consequently, the upper and lower super conducting coils 210 and 211 are kept at temperature of 4.2° K.

In the upper and lower helium vessels 201, upper and lower sensors 215 and 216 are respectively assembled which measure liquid levels 213 and 214 of the respective liquid helium 212. The cryo sensors 215 and 216 are constituted by a super conductive material of which electrical resistance varies in a range of 0 through 20Ω depending on temperature thereof and are connected to the measurement circuit 23 via a terminal portion 217 to thereby measure the height of the liquid helium levels 213 and 214 in the respective upper and lower helium vessels 201, in other words, an amount of liquid helium therein.

Figure 3:
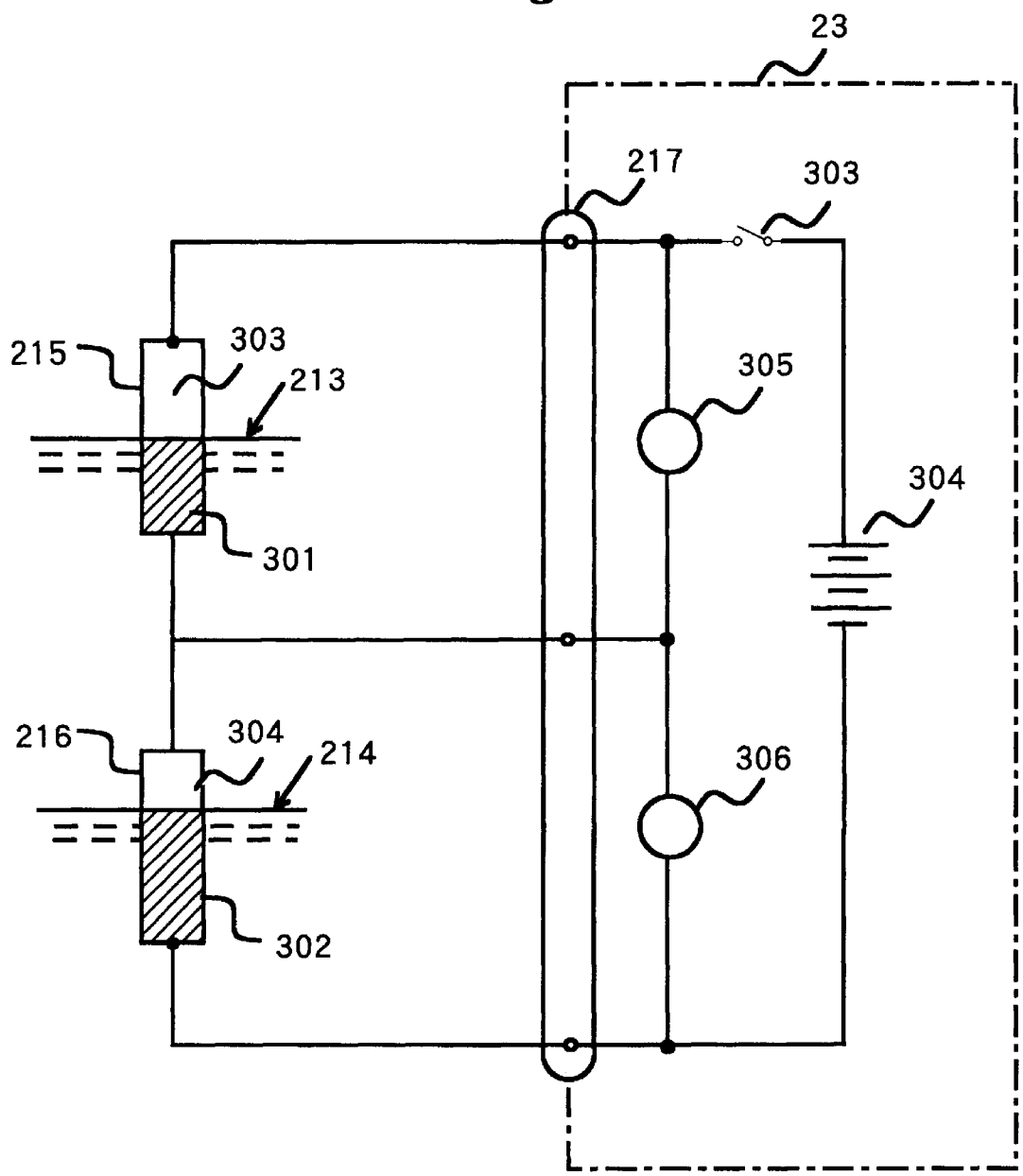
FIG. 3 is an equivalent circuit diagram of liquid helium level sensors and a measurement circuit according to the present invention.

FIG. 3 shows an equivalent circuit of the cryo sensors 215 and 216 and the measurement circuit 23. As shown in the drawing, the cryo sensors 215 and 216 are connected in series and one ends of the cryo sensors 215 and 216 and an intermediate point of both cryo sensors 215 and 216 are respectively connected to the terminal portion 217 for the measurement circuit 23. The measurement circuit 23 is provided with a constant current source 304 which supplies, for example, a constant current of 400 mA to the series connected cryo sensors 215 and 216 via the terminal portion 217, voltmeters 305 and 306 which respectively measure terminal voltages of the respective cryo sensors 215 and 216 and a switch 303 for turning ON and OFF the measurement circuit 23.

In the above arranged structure, when current I is flowed in the cryo sensors 215 and 216 constituted by a super conductive material each of the cryo sensors is heated due to its power consumption $RI^2$ in connection with its resistance value R. In such instance, portions 301 and 302 of the cryo sensors 215 and 216 which are immersed in the helium liquid 212 are kept at temperature of 4.2° K. at which the material shows super conductive state and shows resistance value of zero, and on the other hand portions 303 and 304 thereof which are emerged from the liquid helium 212 show respective resistance values depending on the length thereof. Accordingly, when terminal voltages V1 and V2 of the respective cryo sensor 215 and 216 are measured, lengths from one ends of the respective cryo sensors 215 and 216 to the liquid levels 213 and 214 can be measured.

Such measurement of an amount of liquid helium can be performed manually in response to necessity such as at the time of maintenance and inspection by turning ON the switch 303 in the measurement circuit 23, however, in order to prevent an excessive reduction of liquid helium amount due to such as delayed inspection and unpredictable cause, it is preferable to add an automatic and periodic monitoring function of the liquid helium amount.

Now, a system which performs automatic monitoring of such liquid level will be explained.

Figure 4:
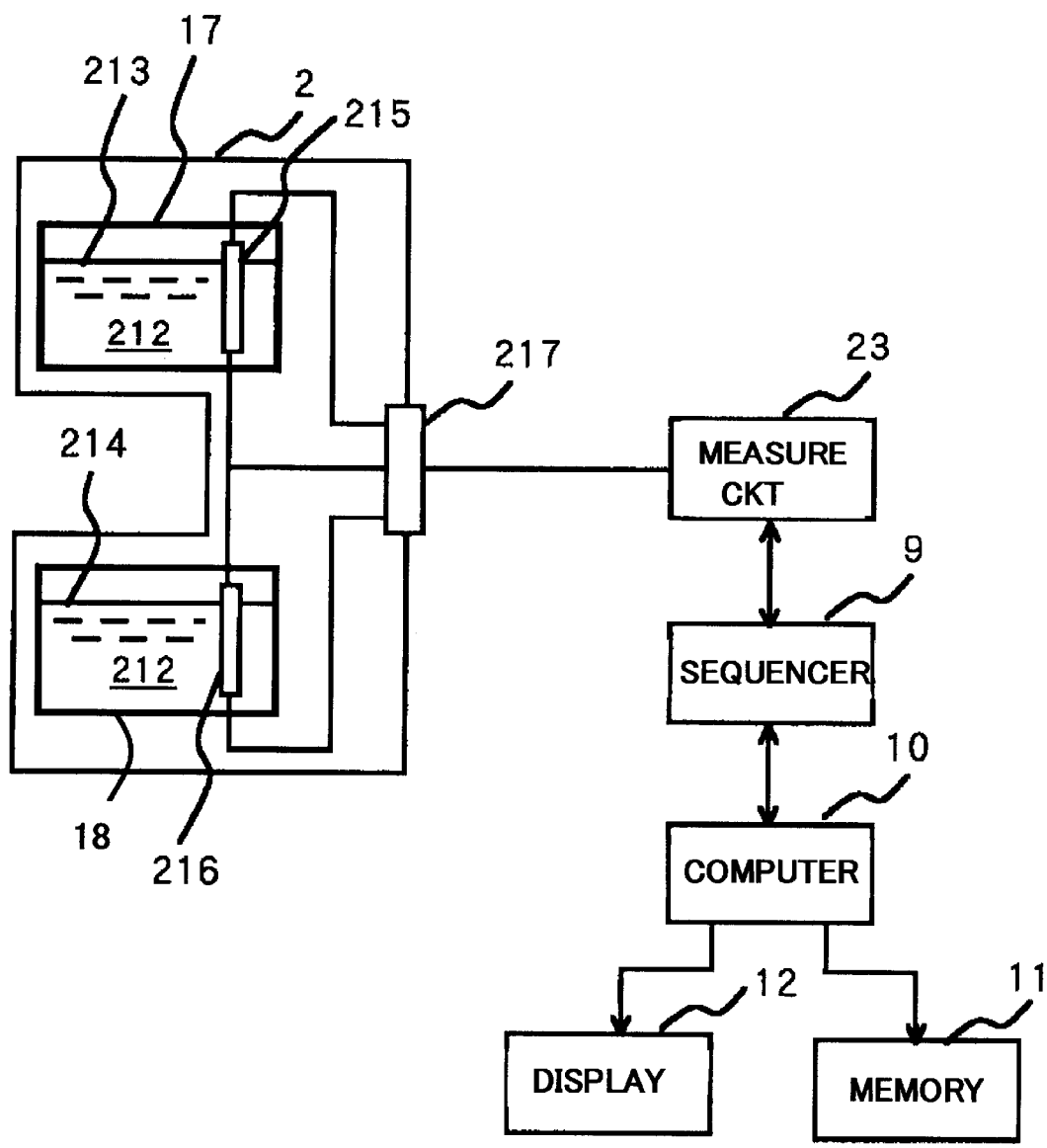
FIG. 4 is a diagram showing an outline of an automatic measurement system of an amount of liquid helium in the present invention.

FIG. 4 shows an outline of such system. As shown in the drawing, the measurement circuit 23 is connected to the computer 10 via the sequencer 9. In the present embodiment, a case where the sequencer 9 and computer 10 for driving such as the gradient magnetic field coils 3 and the radio frequency coils 5 in the MRI apparatus also serve as the sequencer 9 and the computer 10 for the liquid level monitoring system is explained, however, separate from the main body apparatus a liquid level monitoring system can be built. In such instance, a general use computer provided with a display 12, a memory unit 11 and an input unit (not shown) such as key board and a mouse can be used for the computer 10.

In the memory unit 11 of the computer 10 an automatic liquid amount monitoring sequence which will be explained later is assembled in a form of program, and the program is activated by a command from the input unit and controls the measurement circuit 23. Further, the computer 10 receives signals from the measurement circuit 23 and computes amount of liquid helium and decreasing rate thereof, in that variation in the amount of liquid helium as well as prepare graphs thereof to display the same on the display 12. Although not illustrated in the drawing, when the measurement circuit 23 is constituted by analogue circuits, an A/D converter which A/D converts the signals from the measurement circuit 23 is provided between the measurement circuit 23 and the computer 10. In the memory unit 11, lower limit values of liquid levels for respective upper and lower cryo sensors 215 and 216 which are set from the input unit are stored, and these lower limit values are displayed via superposed manner over the graphs showing such as decreasing amounts of liquid helium.

Figure 5:
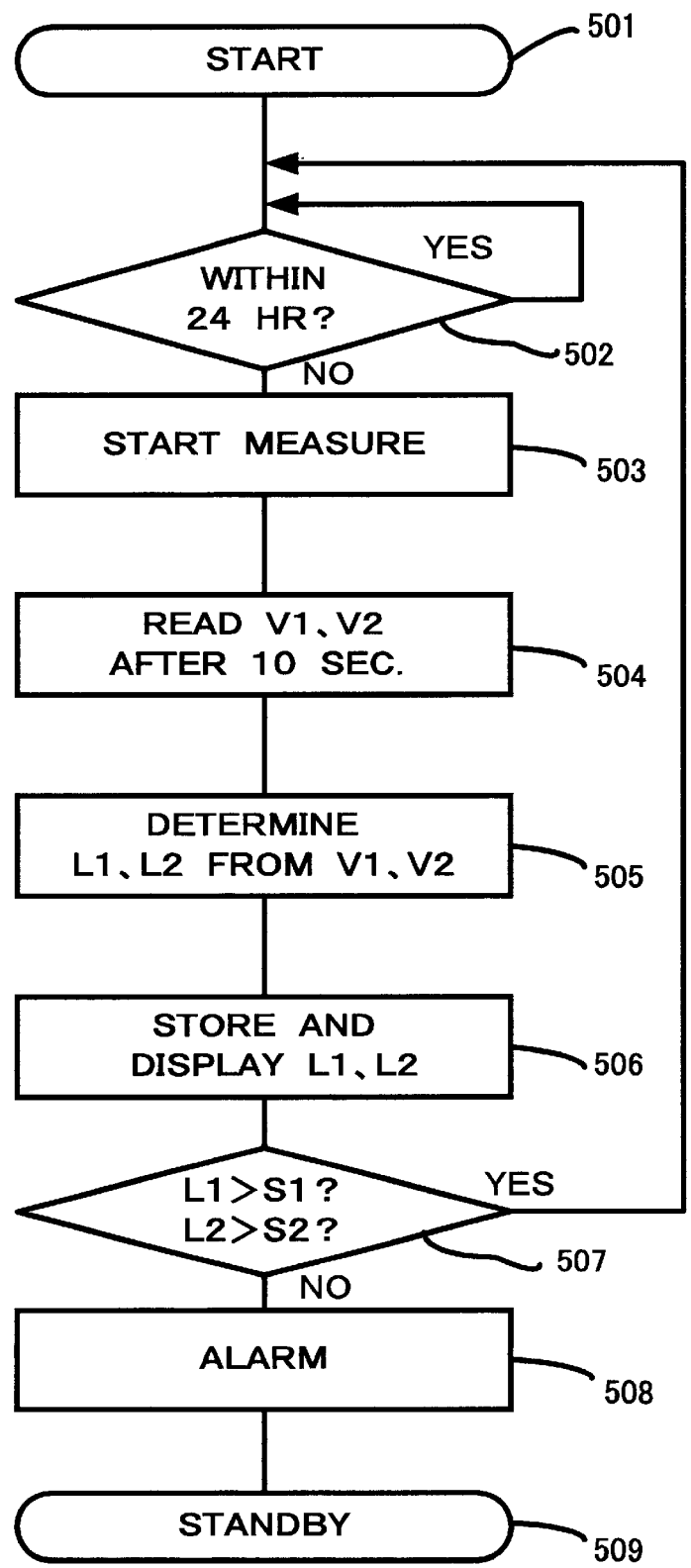
FIG. 5 is a flow chart showing one embodiment of the automatic measurement system in the present invention.

Now, the automatic liquid amount monitoring sequence will be explained. FIG. 5 is a flowchart showing an example of an automatic liquid amount monitoring, and shows an instance wherein the measurement is to be performed at every predetermined period (for example, for every 24 hours). In this sequence, at first after the computer 10 is started (501), a processing of judgement (502) is performed, whether measurement of liquid helium amount was performed, in the past, for example, within 24 hours. When it is judged that such measurement was performed, the processing returns to the condition of after starting. When the measurement was not performed within 24 hours, a trigger signal for measuring the liquid helium amount is sent to the sequencer 9 to thereby turn on the measurement circuit 23 (503). Thus, as has been explained above voltages, V1 and V2 are induced at the respective voltmeters 305 and 306 which correspond to the liquid level heights (or liquid helium reduced amount) with respect to the cryo sensors 215 and 216. In this embodiment, in order to perform an accurate measurement computer 10 waits for a predetermined time after starting required for stabilizing temperature of the cryo sensors, for example, 10 sec. and reads voltages V1 and V2. After reading the voltages, the computer 10 sends another trigger signal to the sequencer 9 to turn off the measurement circuit 23.

Figure 6:
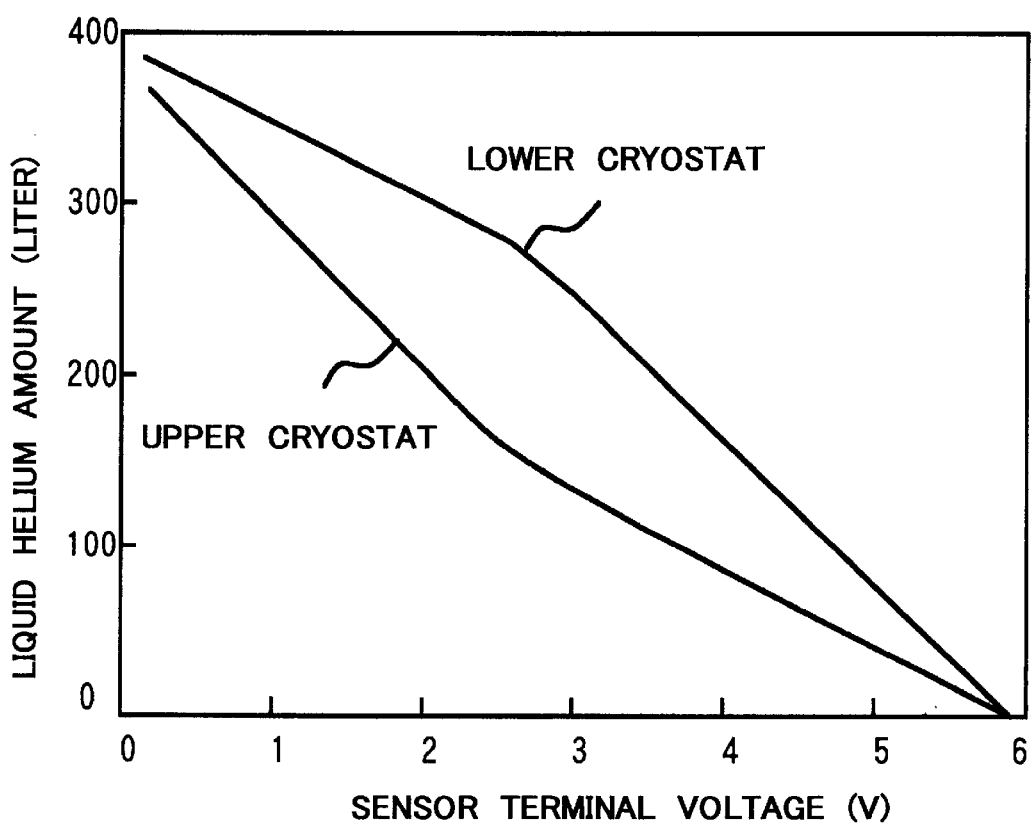
FIG. 6 is a diagram showing a relationship between terminal voltages of the level sensors and amount of liquid helium in the present invention.

The computer 10 calculates the liquid level heights or liquid helium amounts L1 and L2 based on the read voltages V1 and V2 (505), and the same are stored in the memory unit 11 together with the measurement date and time (506). As has been already explained, the terminal voltages V1 and V2 of the respective cryo sensors 215 and 216 correspond to their liquid level heights and are functions of liquid helium amounts. Accordingly, in order to determine an accurate liquid helium amount, it is preferable to prepare a correlation graph between terminal voltages of the cryo sensors and liquid helium amounts as shown in FIG. 6 in advance based on the configurations of the upper and lower helium vessels 201 and to store the same in the memory unit 11.

Thus obtained liquid amount and reduced liquid amount are displayed on the display 12. Thereby, whether liquid helium refilling is necessary or not can be confirmed.

Subsequently, the computer 10 compares thus measured liquid level heights or liquid helium amounts L1 and L2 with designated remaining amounts (lower limit values) S1, and S2 stored in advance for every upper and lower cryostats 17 and 18 and judges whether the liquid helium amounts L1 and L2 are respectively above or below the lower limit values S1 and S2 (507). The designated remaining amounts S1 and S2 are different for every upper and lower cryostats 17 and 18, and, for example, the designated remaining amount S1 for the upper cryostat 17 is determined as 50 liters and the designated remaining amount S2 for the lower cryostat 18 is determined as 120 liters. When the measured liquid helium amount is above the designated remaining amount, the process returns to the state after starting. However, when the measured value is below the designated remaining amount, an alarm is generated (508). As examples of such alarming, an alarm message prompting refilling of liquid helium can be displayed on the display unit 12 or an alarm message or electronic sound can be outputted.

Figure 7:
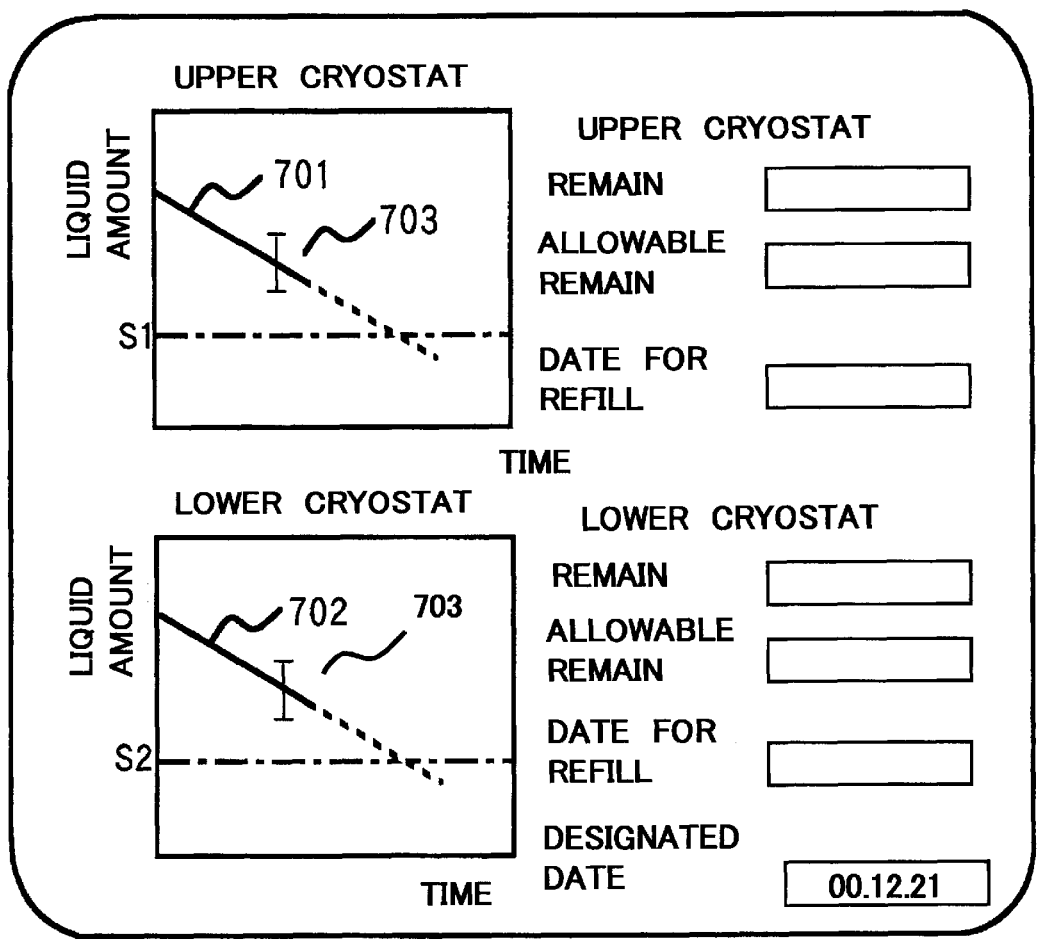
FIG. 7 is a diagram showing an example of variation in an amount of liquid helium which is displayed in a display unit in the present invention.

The computer 10 plots the above periodic measurement results on a graph using time as abscissa and the liquid helium amount as ordinate and displays the same. FIG. 7 shows an example of such display.

In the exemplified display, liquid helium amounts 701 and 702 in the upper and lower cryostats 17 and 18 are respectively displayed on the graphs and horizontal dashed lines colored such as in red represent the designated remaining amounts S1 and S2 for the upper and lower cryostats 17 and 18. As will be observed from the illustrated graphs, the liquid helium amounts 701 and 702 gradually decrease according to lapse of time, the solid lines portions of the liquid helium amounts 701 and 702 in the graphs represent actually measured amounts, therefore, the right ends thereof are the latest data and the dotted line portions thereof represent estimated future decreasing tendencies, therefore, the crossing points with the red horizontal dashed lines indicated the respective date for refilling which are indicated respective right side designated locations. If one desires to ascertain liquid helium remaining amount at a certain specific date, for example, Dec. 21, 2000, one is required to move a cursor to the corresponding date so that the blank of "DESIGNATED DATE" indicates 00. 12. 21 as illustrated then a specific remaining liquid helium amount will be indicated at the blank of "REMAIN", thereby, one can refill liquid helium before an alarm message is generated. Further, the liquid helium amount on the respective graphs can be indicated in % in stead of actual amount, if desired.

Figure 8:
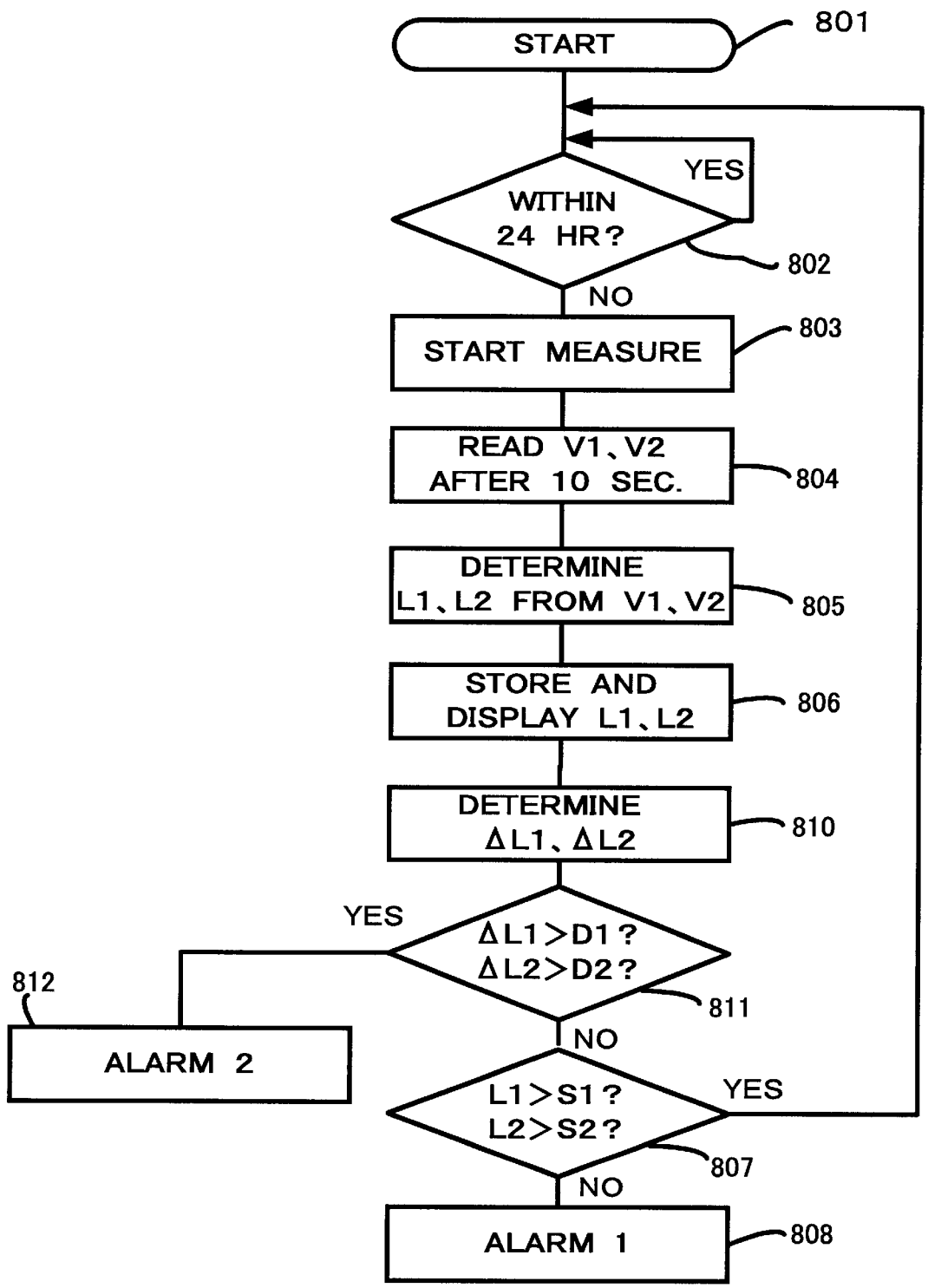
FIG. 8 is a flowchart showing another embodiment of an automatic measurement system in the present invention.

Further, with such graphic display, even when decrease of liquid helium is accelerated by some causes. Such can be visually grasped and a prompt countermeasure can be taken therefor. Further, such monitoring function of liquid helium decreasing rate can be added to the computer 10 in a form of program. A flow of a sequence being added of such liquid helium decreasing rate monitoring function is shown in FIG. 8.

Likely, in this flow, sequences (801–805) from measurement of liquid helium amount performed in every predetermined period until calculation and recording of the liquid helium amounts performed based on the voltage values V1 and V2 are the same as that in FIG. 5. In this flow, differences ΔL1 and ΔL2 between the presently determined liquid helium amounts and the lastly determined liquid helium amounts are determined (810). Subsequently, it is judged whether the determined differences $\Delta L1$ and $\Delta L2$ are above or below predetermined value D1 and D2 (811). A liquid helium decreasing amount due to natural evaporation is, for example, used for the predetermined values D1 and D2. Since the decreasing amount by natural evaporation is empirically known with reference to such as the position (upper or lower) of the cryostat and the capacity thereof, therefore, the decreasing amount per unit time (per measurement internal) is determined to set at D1 and D2. If the determined differences $\Delta L1$ and $\Delta L2$ are within these predetermined values, the process moves to step 807 wherein judgement as same as the step 507 in FIG. 5 is performed. If the determined differences $\Delta L1$ and $\Delta L2$ exceed these predetermined values D1 and D2, it is assumed that a variation in the amount of liquid helium is accelerated by some causes other than natural evaporation thereof and an alarm is generated (812). Although the same alarm as that in step 808 generated when liquid helium amount decreases below the designated remaining amount can be used, however, it is preferable to use another alarm which can be discriminated from the alarm generated at step 808. In response to the alarm at step 812, instead of liquid helium refilling, an inspection of machines and apparatuses such as the cryo cooler 21 is prompted.

Further, in the embodiments as explained in connection with FIGS. 5 and 8, a periodic measurement once in a day was explained, however, the measurement interval can be freely set and altered by a user by making use of the input unit of the computer 10. Further, separate from the above automatic liquid helium amount monitoring function, a manual measurement function is also included which can be activated when a user desires such as when the apparatus is installed and when the operation of the cryo cooler 21 is stopped because of electric power service interruption.

Further, based on the deceasing curve of liquid helium, since date and time of the necessary following refilling of liquid helium can be estimated, data and time can be displayed on the display. When such processing system is assembled, an effective management for usage and maintenance of the open type MRI apparatus can be performed and the operation rate thereof can be enhanced.

According to the present invention, in an open type MRI apparatus using a super conducting magnet which does not give a pressing feeling to a person to be inspected, liquid helium amounts in a plurality of cryostats for the super conducting magnet can be separately and independently measured, thereby, management in response to individual characteristics of the respective cryostats can be performed.

Further, through automation of the measurement and recording of the liquid helium amount, man-made mistakes can be prevented, thereby, operation rate of the super conducting magnet as well as the MRI apparatus can be enhanced.

What is claimed is:

1. A magnetic resonance imaging apparatus comprising: a static magnetic generating device including a pair of upper and lower static magnetic field generating sources which are disposed so as to locate a space for laying a person to be inspected therebetween and respective containers each accommodating one of the pair of upper and lower magnetic field generating sources, each of the magnetic field generating sources is constituted by not less than one super conducting coil, each of the containers contains cooling medium which keeps the super conducting coil at a predetermined temperature, and further comprising measurement means each of which is disposed in a respective one of the containers and sends out an electrical signal representing an amount of cooling medium therein, and computing means which receives the electrical signals from the respective measuring means and computes amount of cooling medium and/or variation in amount of cooling medium in the respective containers.

2. A magnetic resonance imaging apparatus according to claim 1, further comprises a display unit which displays an amount of cooling medium and/or a variation in amount of cooling medium in respective containers together with allowable lower limit values for the amount of cooling medium in each of the respective containers.

3. A magnetic resonance imaging apparatus according to claim 1 or 2, further comprises means which generates an alarm either when an amount of cooling medium reaches the predetermined lower limit value or when a variation in the amount of cooling medium exceeds the predetermined value.

4. A magnetic resonance imaging apparatus according to claim 1 or 2, further comprises a control means which controls the measurement means and the computing means so that the measurement by the measurement means and computation by the computing means are performed with a desired time interval.

5. A magnetic resonance imaging apparatus according to claim 1, wherein the portions of the respective measurement means which are immersed in the respective cooling medium in the upper and lower cryostats show respectively resistance of zero.

6. A magnetic resonance imaging apparatus according to claim 5, wherein the liquid levels of liquid helium in the respective upper and lower cryostats are determined by voltages appearing on the respective measuring means which correspond to respective portions in length of the measuring means above the liquid helium levels.

7. An open type magnetic resonance imaging apparatus comprising:
   a pair of upper and lower cryostats which respectively accommodate a pair of opposing upper and lower super conducting coils between which a photographing space of nuclear magnetic resonance images of a person to be inspected is defined, the upper super conducting coil being disposed near the bottom portion of the upper cryostat and the lower super conducting coil being disposed near the top portion of lower cryostat;
   a cooling medium filled in the upper cryostat for cooling the upper super conducting coil;
   a cooling medium filled in the lower cryostat for cooling the lower super conducting coil;
   an upper liquid level sensor disposed in the upper cryostat for detecting liquid level of the cooling medium filled therein;
   a lower liquid level sensor disposed in the lower cryostat for detecting liquid level of the cooling medium filled therein;
   a measurement circuit which individually processes detection signals from the upper and lower liquid level sensors;
   a computing circuit which computes respective remaining cooling medium amounts in the upper and lower cryostats based on the individual measurement signals from the measurement circuit; and
   a display unit which individually displays the respective computed remaining cooling medium in the upper and lower cryostats based on the computation result of the computing circuit.

8. An open type magnetic resonance imaging apparatus according to claim 7, further comprises a memory unit which stores the computation result of the computing circuit, respective allowable low limit remaining cooling medium amounts, respective allowable decreasing amounts per a predetermined unit time or respective allowable decreasing rates of the respective cooling media in the upper and lower cryostats.

9. An open type magnetic resonance imaging apparatus according to claim 8, wherein the computing circuit further computes respective decreasing amounts per a predetermined unit time and respective decreasing rates of the respective cooling media in the upper and lower cryostats based on the present computing result and the latest computing result stored in the memory unit and compares the respective computed present remaining cooling medium amounts and the respective computed decreasing amounts and the respective computed decreasing rates with the respective allowable low limit remaining cooling medium amounts, the respective allowable decreasing amounts per a predetermined unit time and the respective allowable decreasing rates of the respective cooling media in the upper and lower cryostats which are stored in the memory unit.

10. An open type magnetic resonance imaging apparatus according to claim 9, wherein when the comparison results performed in the computing circuit reveals that one of computed remaining cooling medium amount, decreasing amounts and decreasing rates exceeds the respective allowable lower limit remaining cooling medium amounts, decreasing amounts and decreasing rate of the cooling media in the upper and lower cryostats, the display unit individually generates an alarm for respective concerned upper and lower cryostats.

11. An open type magnetic resonance imaging apparatus according to claim 9, wherein the computing circuit estimates liquid helium refilling date for the respective upper and lower cryostats based on the computed respective remaining cooling medium amounts and the respective liquid helium decreasing amounts per a predetermined unit time, and the display unit displays the respective estimated date for refilling for the upper and lower cryostats.

12. An open type magnetic resonance imaging apparatus according to claim 9, wherein the display unit displays the respective computed remaining liquid helium amounts, the respective computed liquid helium decreasing amounts per a predetermined unit time and the respective allowable low limit remaining cooling medium amounts in a form of graph with time representing abscissa and individually for the respective upper and lower cryostats.

13. A magnetic resonance imaging apparatus according to claim 3, further comprises a control means which controls the measurement means and the computing means so that the measurement by the measurement means and computation by the computing means are performed with a desired time interval.

* * * * *